US011191166B2

(12) United States Patent
Chen et al.

(10) Patent No.: US 11,191,166 B2
(45) Date of Patent: Nov. 30, 2021

(54) FABRICATION METHOD OF FLEXIBLE ELECTRONIC DEVICE

(71) Applicant: E Ink Holdings Inc., Hsinchu (TW)

(72) Inventors: Kuo-Feng Chen, Hsinchu (TW); Shu-Han Huang, Hsinchu (TW); Ching-Hung Huang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 253 days.

(21) Appl. No.: 15/788,825

(22) Filed: Oct. 20, 2017

(65) Prior Publication Data

US 2018/0213649 A1  Jul. 26, 2018

(30) Foreign Application Priority Data

Jan. 25, 2017 (CN) .......................... 201710061112.1

(51) Int. Cl.
*H05K 3/00* (2006.01)
*B32B 37/06* (2006.01)
(Continued)

(52) U.S. Cl.
CPC ............. *H05K 3/007* (2013.01); *B32B 37/10* (2013.01); *H05K 3/0052* (2013.01); *H05K 3/0055* (2013.01); *H05K 3/0097* (2013.01); B32B 27/08 (2013.01); B32B 37/06 (2013.01); B32B 37/182 (2013.01); B32B 38/0004 (2013.01); B32B 38/10 (2013.01); B32B 2457/00 (2013.01); H05K 2203/0156 (2013.01); H05K 2203/065 (2013.01); H05K 2203/107 (2013.01)

(58) Field of Classification Search
CPC .... H05K 3/007; H05K 3/0052; H05K 3/0055; H05K 3/0097; H05K 3/4682; B23K 3/025
See application file for complete search history.

(56) References Cited

U.S. PATENT DOCUMENTS

| 3,948,429 | A | * | 4/1976 | Davies | ................... B23K 3/025 228/44.7 |
| 5,390,079 | A | * | 2/1995 | Aomori | ................... B23K 1/002 361/749 |

(Continued)

FOREIGN PATENT DOCUMENTS

| CN | 1796105 | 7/2006 |
| CN | 101484988 | 7/2009 |

(Continued)

OTHER PUBLICATIONS

"Office Action of Taiwan Counterpart Application," dated May 17, 2018, p. 1-p. 8.

(Continued)

Primary Examiner — Livius R. Cazan
(74) Attorney, Agent, or Firm — JCIPRNET (57) ABSTRACT

A fabrication method of a flexible electronic device is provided. A flexible substrate is placed directly on a rigid substrate. A portion of an edge of the flexible substrate is heated, such that the heated portion of the edge of the flexible substrate constitutes a melted edge. An electronic element is formed on the flexible substrate and located in an area region surrounded by the melted edge. A separation process is performed, such that the melted edge is separated from the flexible substrate to form a flexible electronic device.

13 Claims, 9 Drawing Sheets

(51) Int. Cl.
  *B32B 37/10* (2006.01)
  *B32B 37/18* (2006.01)
  *B32B 38/00* (2006.01)
  *B32B 38/10* (2006.01)
  *B32B 27/08* (2006.01)

(56) References Cited

U.S. PATENT DOCUMENTS

| | | | |
|---|---|---|---|
| 9,287,077 B2 | 3/2016 | Su et al. | |
| 9,502,340 B2 * | 11/2016 | Narumi | H01L 23/49822 |
| 2009/0322980 A1 | 12/2009 | Whangbo et al. | |
| 2010/0298395 A1 * | 11/2010 | Heidelbaugh | A61K 31/4166 |
| | | | 514/392 |
| 2014/0315463 A1 | 10/2014 | Khachatryan | |

FOREIGN PATENT DOCUMENTS

| | | |
|---|---|---|
| CN | 102455453 | 5/2012 |
| CN | 103391694 | 11/2013 |
| CN | 103682177 | 3/2014 |
| CN | 104362263 | 2/2015 |
| CN | 104752443 | 7/2015 |
| CN | 105023872 | 11/2015 |
| CN | 105023872 A * | 11/2015 |
| TW | 201347629 | 11/2013 |

OTHER PUBLICATIONS

"Office Action of China Counterpart Application", dated Dec. 27, 2019, p. 1-p. 9.

"Office Action of China Counterpart Application", dated Sep. 14, 2021, p. 1-p. 5.

* cited by examiner

FABRICATION METHOD OF FLEXIBLE ELECTRONIC DEVICE

CROSS-REFERENCE TO RELATED APPLICATION

This application claims the priority benefit of China application serial no. 201710061112.1, filed on Jan. 25, 2017. The entirety of the above-mentioned patent application is hereby incorporated by reference herein and made a part of this specification.

FIELD OF THE INVENTION

The invention relates to a fabrication method of an electronic device. More particularly, the invention relates to a fabrication method of a flexible electronic device.

DESCRIPTION OF RELATED ART

Flexible electronic devices have significant development potential owing to advantages of light weight, portability, flexibility, and so forth. To achieve flexibility, the use of a flexible substrate is required in a flexible electronic device. Nevertheless, the flexibility of the flexible substrate also prevents an electronic element from being fabricated directly on the flexible substrate. If the electronic element is to be fabricated on the flexible substrate, the flexible substrate is required to be adhered to a rigid substrate or a machine because the rigid substrate or the machine is able to provide sufficient support. Thereby, the electronic element may be fabricated on the flexible substrate. As such, the flexible substrate has to be removed from the rigid substrate or the machine after the electronic element is fabricated.

Conventionally, in order to remove the flexible substrate from a carrier plate, the flexible substrate is first adhered to the rigid substrate by attaching a de-bonding layer or by applying a spray coating method. Next, a mechanical peeling technique is applied to exert an adequate peeling force, so as to separate the flexible substrate from the carrier plate. In the event that the spray coating method is applied, the issue of the remaining air bubbles may occur when the flexible substrate is adhered to the rigid substrate, and uniformity of the flexible substrate covering the rigid substrate may thus be reduced, which leads to the poor fabrication yield of the electronic element in subsequent manufacturing processes. Moreover, when the electronic element is fabricated on the flexible substrate, uniformity of overall rigidity strength may be uneven. In other words, rigidity of some area regions is greater, and therefore different peeling forces are required to be applied during mechanical peeling. As a result, damages to the element may occur in an area region where a greater peeling force is exerted, leading to the poor fabrication yield.

SUMMARY OF THE INVENTION

The invention provides a fabrication method of a flexible electronic device, and the fabrication yield of the flexible electronic device is favorable.

In an embodiment of the invention, a fabrication method of a flexible electronic device includes following steps. A flexible substrate is placed directly on a rigid substrate. A portion of an edge of the flexible substrate is heated, and the heated portion of the edge of the flexible substrate constitutes a melted edge. At least one electronic element is formed on the flexible substrate. The electronic element is located in an area region surrounded by the melted edge. A separation process is performed, and the melted edge is separated from a first flexible substrate to form the flexible electronic device.

In an embodiment of the invention, the first flexible substrate is completely surrounded by the melted edge.

In an embodiment of the invention, the step of heating the portion of the edge of the flexible substrate includes performing a first heating process, such that a first heated portion of the edge of the flexible substrate constitutes a first melted edge. The step also includes performing a second heating process, such that a heated second portion of the edge of the flexible substrate constitutes a second melted edge.

In an embodiment of the invention, the first flexible substrate is completely surrounded by the first melted edge and the second melted edge.

In an embodiment of the invention, the first heating process is performed under a first ambient air pressure, and the second heating process is performed under a second ambient air pressure. The first ambient air pressure is greater than or equal to the second ambient air pressure.

In an embodiment of the invention, the fabrication method of the flexible electronic device further includes following steps. A planarizing process is performed on the flexible substrate after the melted edge is formed. The planarizing process includes at least one of a pressurization step, a heating step, and an environmental depressurization step.

In an embodiment of the invention, the heating step includes using at least one of a heating plate and an oven.

In an embodiment of the invention, the pressurization step includes applying a pressure to the rigid substrate from a surface of the flexible substrate by exerting a mechanical force.

In an embodiment of the invention, the environmental depressurization step includes placing the rigid substrate and the flexible substrate in a device with a closed chamber and lowering an air pressure in the device.

In an embodiment of the invention, the area region surrounded by the melted edge of the flexible substrate is in direct contact with the rigid substrate through a Van der Vaals force or an electrostatic force.

In an embodiment of the invention, the step of heating the portion of the edge of the flexible substrate includes laser heating or contact heating.

In an embodiment of the invention, the contact heating step is performed by contacting the portion of the edge of the flexible substrate with a heated object.

In an embodiment of the invention, the heated object includes soldering iron.

In an embodiment of the invention, the separation process includes cutting the flexible substrate along an inner side of the melted edge, such that the melted edge is separated from the flexible substrate.

In an embodiment of the invention, the separation process further includes removing the cut flexible substrate from the rigid substrate after the melted edge is separated from the flexible substrate.

In an embodiment of the invention, a material of the rigid substrate is glass or metal.

In an embodiment of the invention, a material of the flexible substrate includes a polymer, and a glass transition temperature of the flexible substrate is lower than a glass transition temperature of the rigid substrate or a melting point of the rigid substrate.

In an embodiment of the invention, the rigid substrate and the flexible substrate are made of the same material, and a thickness of the rigid substrate is greater than a thickness of the flexible substrate.

In an embodiment of the invention, the area region surrounded by the melted edge includes a first area region and a second area region that are arranged in a side-by-side manner, and the step of forming the at least one electronic element includes forming a first electronic element and a second electronic element respectively in the first area region and the second area region. The separation process further includes separating the first area region from the second area region, so as to respectively form a first electronic device having the first electronic element and a second electronic device having the second electronic element.

In another embodiment of the invention, the fabrication method of the flexible electronic device further includes following steps. A second flexible substrate is placed directly on the rigid substrate. A portion of an edge of the second flexible substrate is heated, such that the heated portion of the edge of the second flexible substrate constitutes another melted edge. At least another electronic element is formed on the second flexible substrate. The at least another electronic element is located in an area region surrounded by another melted edge. Another separation process is performed, such that the another melted edge is separated from the second flexible substrate to form at least another flexible electronic device.

In view of the foregoing, according to the fabrication method of the flexible electronic device provided in the embodiments of the invention, a peeling force required in the separation process performed on the area region disposed with the electronic element is reduced, and components on the flexible electronic device are less likely to be damaged. As such, the fabrication method of the flexible electronic device provides a good fabrication yield.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
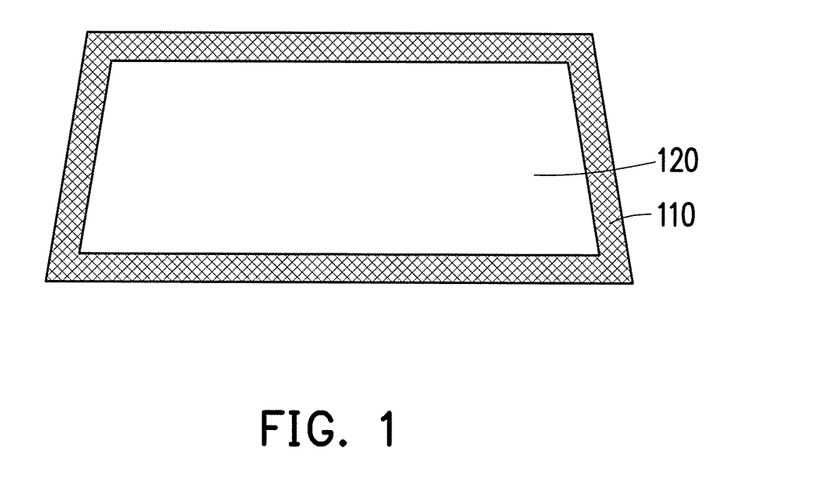
FIG. 1 is a schematic view of a step of placing a flexible substrate in a fabrication method of a flexible electronic device according to an embodiment of the invention.

Referring to FIG. 1, a flexible substrate 120 is directly placed on a rigid substrate 110. An area of the rigid substrate 110 is greater than or equal to an area of the flexible substrate 120, such that the flexible substrate 120 is completely supported by the rigid substrate 110. In the step, the flexible substrate 120 and the rigid substrate 110 are adhered to each other through the Van der Vaals force or an electrostatic force. Therefore, adhesion between the flexible substrate 120 and the rigid substrate 110 is not strong, and the flexible substrate 120 may be removed from the rigid substrate 110 in the subsequent manufacturing process in no need of applying a strong peeling force. In other words, according to the embodiment, no heterogeneous bonding medium, e.g., an adhesive, a colloid, etc., exists between the rigid substrate 110 and the flexible substrate 120.

In the embodiment, a material of the flexible substrate 120 is, for example, polyimide, (PI), polycarbonate (PC), polyethersulfone (PES), polyacrylate (PA), polynorbornene (PNB), polyethylene terephthalate (PET), polyetheretherketone (PEEK), polyethylene naphthalate (PEN), polyetherimide (PEI), or other flexible materials. A material of the rigid substrate 110 is, for example, glass or metal. However, the invention is not limited thereto. In an embodiment, the rigid substrate 110 and the flexible substrate 120 may selectively have the same material. A thickness of the rigid substrate 110 is greater than a thickness of the flexible substrate 120, such that the rigid substrate 110 may be mechanically solid to support the flexible substrate 120. Besides, the flexible substrate 120 has a greater flexibility.

Figure 2:
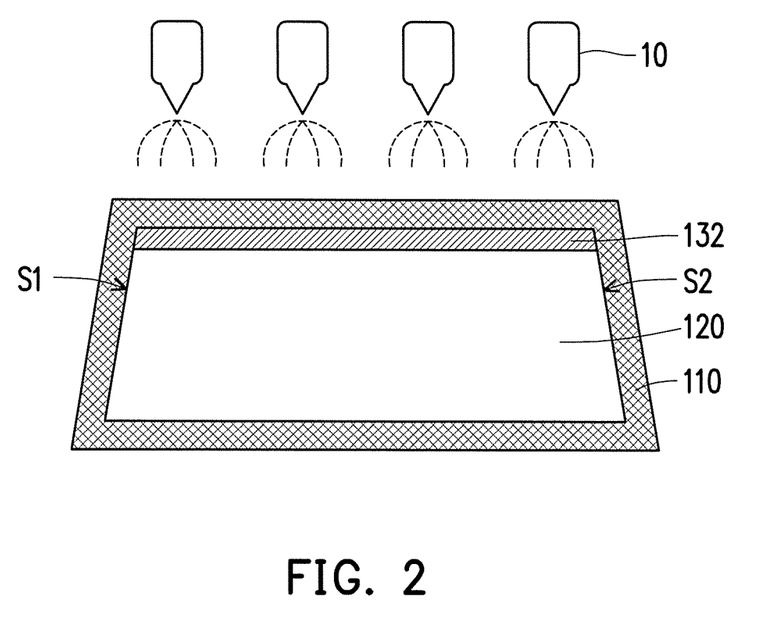
FIG. 2 is a schematic view of a heating step in a fabrication method of a flexible electronic device according to an embodiment of the invention.
Figure 3:
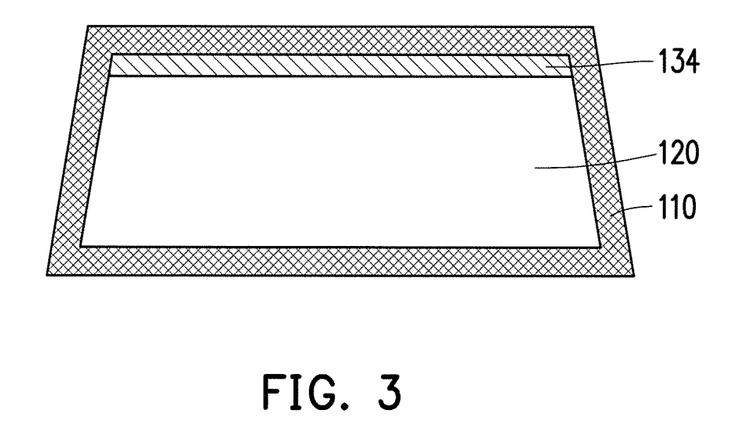
FIG. 3 is a schematic view of a device after undergoing a heating step in a fabrication method of a flexible electronic device according to an embodiment of the invention.

Referring to FIG. 2 and FIG. 3, a first heating process is performed to heat a first portion 132 of an edge of the flexible substrate 120, such that the heated first portion 132 of an edge of a first flexible substrate 120 constitutes a melted edge 134. In the step, a heating device may be used to heat the first portion 132 of the edge of the first flexible substrate 120. If a temperature of the first portion 132 after being heated is higher than a glass transition temperature (Tg) of the first flexible substrate 120 or a melting point of the first flexible substrate 120, the heated first portion 132 may therefore be softened or melted. After the first heating process is completed, the softened or melted first portion 132 is cured to form the melted edge 134. At this time, the first flexible substrate 120 may be adhered to the rigid substrate 110 more firmly through the melted edge 134, and the remaining portion of the flexible substrate 120 may still be attached to the rigid substrate 110 through the Van der Vaals force or the electrostatic force. Therefore, in the subsequent fabrication process, a major portion of the flexible substrate 120 is still attached to the rigid substrate 110 through the Van der Vaals force or the electrostatic force, such that the flexible substrate 120 may be removed from the rigid substrate 110 in no need of exerting a strong peeling force.

In the embodiment, a heating step of the first heating process is, for example, a laser heating step, wherein the first portion 132 of the edge of the first flexible substrate 120 is irradiated by a laser beam generated by a laser heating device 10, for instance. An irradiation path of the laser beam may be distributed along the first portion 132. Meanwhile, the first portion 132 irradiated by the laser beam is softened or melted after absorbing the energy of the laser beam, and then the first portion 132 is cured to form the melted edge 134. In the embodiment, a plurality of the laser heating devices 10 may be used to generate the laser beams to irradiate the first portion 132 and to form the melted edge 134. In another embodiment, a single laser heating device 10 may also be used to generate the laser beam and may be moved, such that the laser beam, for example, travels from a first side S1 of the first flexible substrate 120 to a second side S2 of the first flexible substrate 120 along the first portion 132. Thereby, a first melted edge 134 may be distributed continuously from the first side S1 to the second side S2. The first side S1 is opposite to the second side S2.

In another embodiment, the heating step of the first heating process may be, for example, a contact heating step. For example, a heated object such as soldering iron may be used as a heating device in replacement of the laser heating device 10. The heated object at a high temperature contacts the first portion 132 of the edge of the flexible substrate 120, and the flexible substrate 120 and the first portion 132 in contact with the heating device are thereby softened or melted and then are cured to form the melted edge 134. In the embodiment, a length of the heating device may be equal to or greater than a length of the first portion 132. Therefore, the flexible substrate 120 and the first portion 132 in contact with the heating device may together constitute the first melted edge 134 at once. Nevertheless, in other embodiments, the length of the heating device may be selectively less than the length of the first portion 132, and the heating device may be moved during the heating process to contact different sections of the first portion 132 and form the melted edge 134.

Figure 4A:
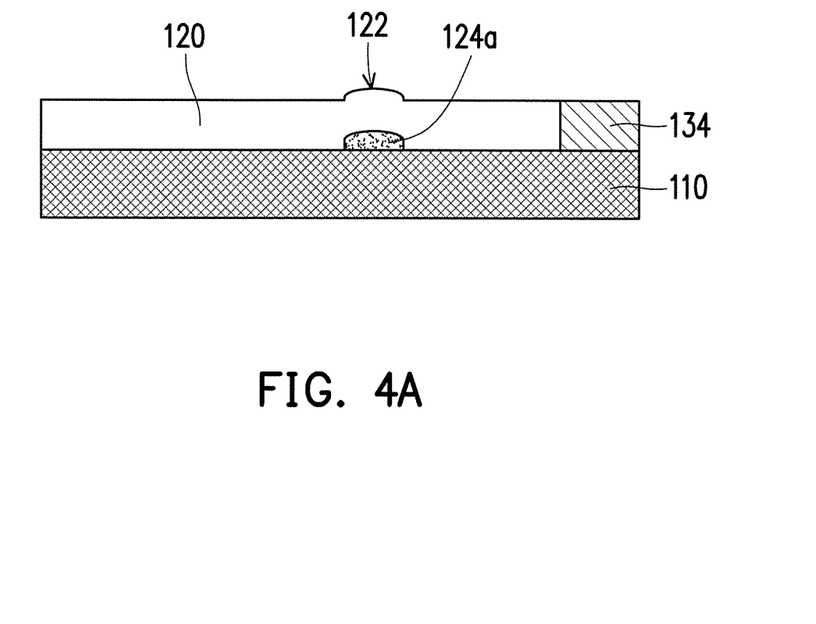
FIG. 4A is a schematic cross-sectional view of an air cavity existing between a flexible substrate and a rigid substrate in a fabrication method of a flexible electronic device according to an embodiment of the invention.
Figure 4B:
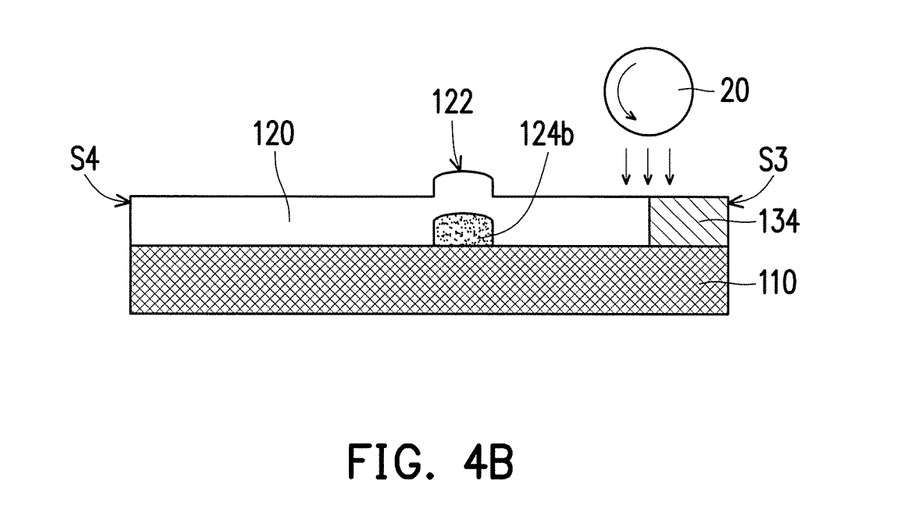
FIG. 4B is a schematic cross-sectional view of a step of removing an air cavity in a fabrication method of a flexible electronic device according to an embodiment of the invention.

Next, referring to FIG. 4A and FIG. 4B, after the flexible substrate 120 is placed directly on the rigid substrate 110, residual air may exist between the flexible substrate 120 and the rigid substrate 110. An air cavity 124a (possibly referred to as a bubble) may exist between the flexible substrate 120 and the rigid substrate 110, and a protruding portion 122 is formed. As such, after the first heating process is completed to form the melted edge 134, a planarizing process may further be selectively applied to the flexible substrate 120. The planarizing process may include a pressurization step, a heating step, an environmental depressurization step, or a combination of the foregoing.

Referring to FIG. 4A and FIG. 4B, the planarizing process may be realized by heating the rigid substrate 110. A temperature at which the rigid substrate 110 is heated may be lower than a temperature at which the melted edge 134 is formed, for example, lower than a glass transition temperature of the flexible substrate 120. When an air cavity 124b expands, internal air of the air cavity 124b may be expelled, such that the flexible substrate 120 is continuously spread out flatly on the rigid substrate 110 flatly. In some embodiments, the step of heating the air cavity 124a allows the air of the air cavity 124a to expand when a temperature of the air cavity 124a rises, such that the air cavity 124b is formed. A volume of the air cavity 124b is greater than a volume of the air cavity 124a. Therefore, in some embodiments, the planarizing process may be realized by selectively adopting the heating step along with at least one of the pressurization step and the environmental depressurization step.

In the heating step of the planarizing process, for example, the rigid substrate 110 adhered to the flexible substrate 120 may be placed on the heating device, e.g., a heating plate (not shown). The rigid substrate 110, the flexible substrate 120, and the air cavity 124a are heated due to the heating effect of the heating plate. In another embodiment, the heating device may be, for example, an oven (not shown) for performing a baking process. The environmental temperature is raised through the backing process by the oven, such that the rigid substrate 110, the flexible substrate 120, and the air cavity 124a are heated. Nevertheless, the invention is not limited to what is described in the embodiment.

Figure 4C:
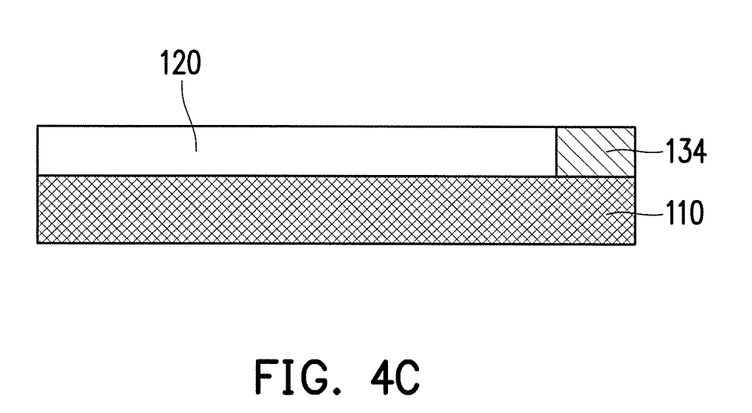
FIG. 4C is a schematic cross-sectional view of a device after an air cavity is removed in a fabrication method of a flexible electronic device according to a first embodiment of the invention.

Next, referring to FIG. 4B and FIG. 4C, in the pressurization step of the planarizing process, for example, a pressure is applied from a surface of the flexible substrate 120 in a direction toward the rigid substrate 110 by a pressurization device 20, such that air of the air cavity 124b is expelled by the pressure. Thereby, the flexible substrate 120 covering the rigid substrate 110 may be spread over the rigid substrate 110 flatly to better ensure the flatness of the surface, which is conducive to enhancing a fabrication yield when fabricating an electronic element in the subsequent process. In other words, the planarizing process may be realized by adopting the pressurization step.

In the embodiment, pressure from a mechanical force in the pressurization step may be exerted from the surface of the flexible substrate 120 toward the rigid substrate 110 by a roller, and a moving direction of the roller is, for example, from a third side S3 corresponding to the melted edge 134 in the flexible substrate 120 to a fourth side S4, such that air of the air cavity 124b is pressurized and expelled toward the fourth side S4. The third side S3 is opposite to the fourth side S4.

In an embodiment, after the melted edge 134 is formed, the planarizing process may be realized by selectively performing the heating step and performing the pressurization step. Moreover, the heating step and the pressurization step may be performed in a random order, or the pressurization and the heating steps may be repeated.

In addition, a step of forming the melted edge 134 may be performed under a first ambient air pressure, and the planarizing process may be performed under a second ambient air pressure. The first ambient air pressure is greater than the second ambient air pressure. Thereby, the air cavity 124*a* shown ill FIG. 4A may be easily expelled because the ambient air pressure of the flexible substrate 120 is relatively low in the planarizing process.

For example, after the melted edge 134 is formed, the rigid substrate 110 and the overlying flexible substrate 120 adhered thereto may be placed in a device (not shown) with a closed chamber. The environmental depressurization step may be performed to expel air of the air cavity 124*a* in FIG. 4A and to lower an air pressure in the device, such that the planarizing process is performed on the flexible substrate 120, and that air of the air cavity 124*a* is expelled through environmental depressurization. In addition, in other applicable embodiments, the device with the closed chamber may be an oven. The oven may be selectively used to perform the heating process under a first ambient air pressure, such that the environmental temperature in the oven is increased to a temperature lower than or equal to a melting temperature of the flexible substrate 120. At the same time, the air cavity 124*a* may be expanded to become the air cavity 124*b* as shown in FIG. 4B. Next, the environmental depressurization step may be performed, such that the ambient air pressure is decreased to a second ambient air pressure, and air of the air cavity 124*b* is expelled. Alternately, in other applicable embodiments, the environmental depressurization step may be selectively performed prior to the heating step, or the environmental depressurization step and the heating step may be repeatedly performed.

In sum, the planarizing process may include any of the pressurization step, the heating step, and the environmental depressurization step or a combination of the foregoing, and the order of performing individual steps may be adjusted according to actual requirements. Besides, the planarizing process may also include any step of expelling air between the flexible substrate 120 and the rigid substrate 110.

Figure 5A:
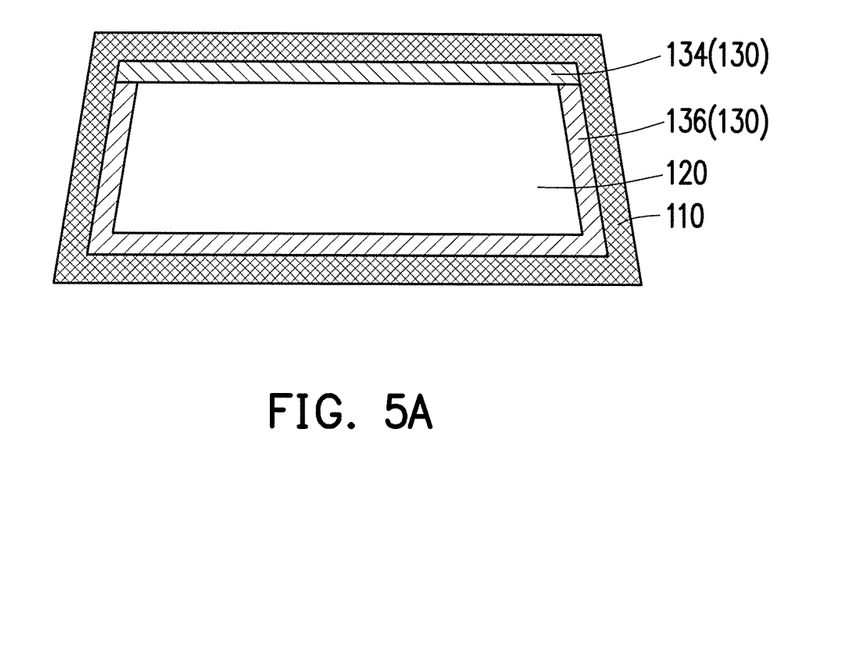
FIG. 5A is a schematic view of a heating step in a fabrication method of a flexible electronic device according to an embodiment of the invention.

Referring to FIG. 5A, after the planarizing process is completed, a second heating process may be performed to heat a second portion (not shown) of the edge of the flexible substrate 120, such that the heated second portion (not shown) of the edge of the flexible substrate 120 constitutes a second melted edge 136. The first portion and the second portion of the edge may be different portions. According to the embodiment, the first portion and the second portion substantially constitute the entire edge of the flexible substrate 120. Thereby, the melted edge 134 formed by performing the first heating process and the melted edge 136 formed by performing the second heating process are connected to form a melted edge 130 that completely forms the surroundings of the flexible substrate 120. Note that the invention is not limited thereto.

In an embodiment, the first heating process may be performed under the first ambient air pressure, and the second heating process may be performed under the second ambient air pressure. The first ambient air pressure is greater than or equal to the second ambient air pressure. For example, a heating step of the second heating process may be performed under a low-pressure environment, e.g., a vacuum environment, such that an air cavity constituted by air is hardly to be formed between the flexible substrate 120 and the rigid substrate 110. Alternately, the adhesion between the flexible substrate 120 and the rigid substrate 110 becomes greater, and the flexible substrate 120 covering the rigid substrate 110 has greater planarity.

Figure 5B:
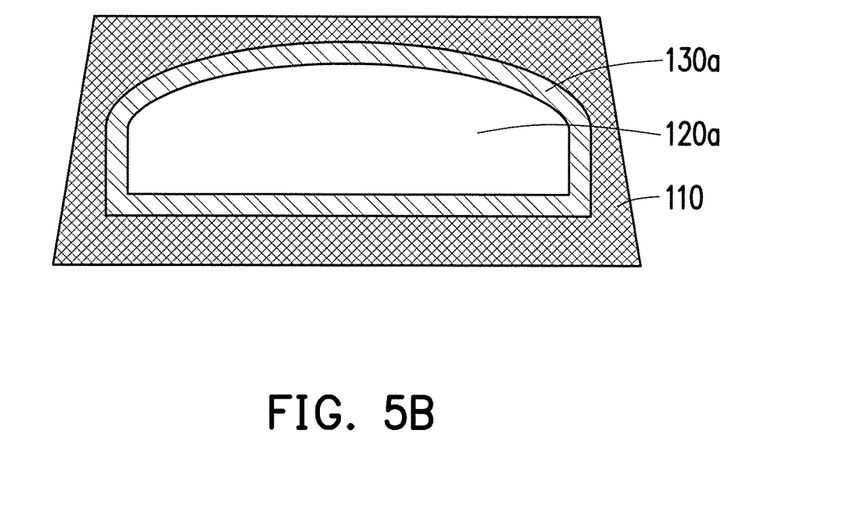
FIG. 5B is a schematic view illustrating a device where a melted edge is already formed in a fabrication method of a flexible electronic device according to another embodiment of the invention.

In an embodiment, the flexible substrate 120 is not limited to be shaped as a quadrangle. For example, the flexible substrate 120 may have a contour of a circle, an ellipse, or a non-quadrangle. The melted edge 130 completely surrounds the flexible substrate 120. For example, as shown in FIG. 5B, a portion of a flexible substrate 120*a* is arc-shaped, and a melted edge 130*a* is completely surroundings of the flexible substrate 120*a*.

Figure 6:
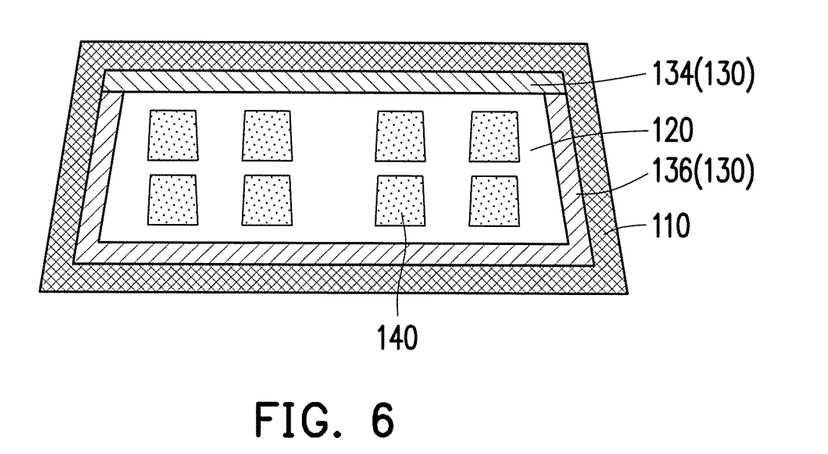
FIG. 6 is a schematic view of a step of forming an electronic element in a fabrication method of a flexible electronic device according to an embodiment of the invention.

Referring to FIG. 6, after the melted edge 130 that completely surrounds the flexible substrate 120 is formed, a first electronic element 140 is formed on the flexible substrate 120. The first electronic element 140 is located in an area region surrounded by the melted edge 130, and the flexible substrate 120 is located between the first electronic element 140 and the rigid substrate 110. The first electronic element 140 may be formed and appropriately adjusted as required by the flexible electronic device, and no other explanation is provided hereinafter. A fabrication method of the first electronic element 140 may, for instance, include any step of forming a display element, a sensing element, a touch element, or other similar elements. During a process of forming the first electronic element 140, the first flexible substrate 120 is firmly adhered to the rigid substrate 110 due to the adhesive characteristic of the melted edge 130, such that the fabrication process of the first electronic element 140 may be relatively simple, and that no fabrication error may occur due to the flexibility of the first flexible substrate 120. Thereby, the fabrication yield of the first electronic element 140 may be enhanced.

Figure 7:
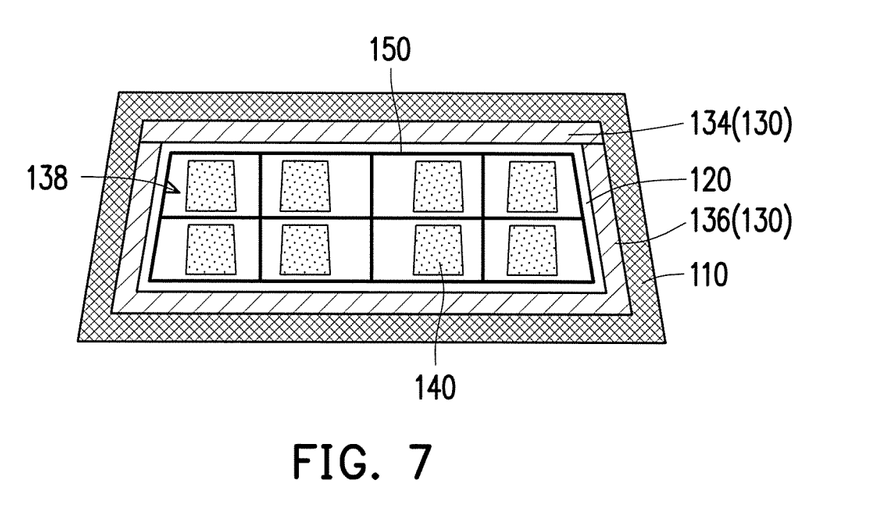
FIG. 7 is a schematic view of a separation step in a fabrication method of a flexible electronic device according to an embodiment of the invention.
Figure 8:
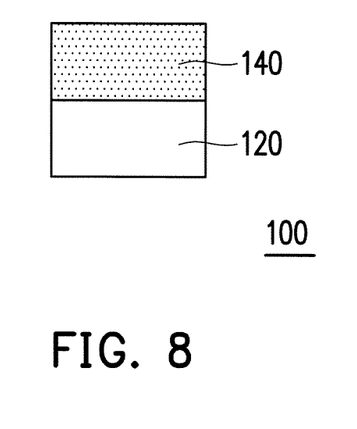
FIG. 8 is a schematic cross-sectional view of a first electronic device according to an embodiment of the invention.

Referring to FIG. 7, after the first electronic element 140 is formed, a separation process is performed. The melted edge 130 is separated from the flexible substrate 120 to form a flexible electronic device. In the embodiment, during the separation process, for example, the flexible substrate 120 is cut along a cutting line 150 of an inner side of the melted edge 130, such that the melted edge 130 is separated from the flexible substrate 120. Specifically, the method of cutting the flexible substrate 120 along the cutting line 150 of the inner side of the melted edge 130 is, for example, mechanical cutting or laser cutting, but the invention is not limited thereto. Next, after the flexible substrate 120 is cut, the flexible substrate 120 having the first electronic element 140 may be removed from the rigid substrate 110, so as to form a first electronic device 100 (shown in FIG. 8) having the flexible substrate 120 on which the first electronic element 140 is located. In the embodiments illustrated in FIG. 6 and FIG. 7, one single flexible substrate 120 may be used to form a plurality of the first electronic devices 100. Nevertheless, in other embodiments, one single flexible substrate 120 may be used to form one single first electronic device 100. Moreover, in the steps shown in FIG. 6, it is possible to merely form one electronic element on the flexible substrate 120, and the cutting line 150 having a mesh track as shown in FIG. 7 may alternatively have a frame-shaped track.

In the separation process, after the flexible substrate 120 is cut along the cutting line 150, the flexible substrate 120 having the first electronic element 140 may be removed from the rigid substrate 110 without applying a strong peeling force. This is because the flexible substrate 120 and the rigid substrate 110 are adhered to each other merely through the Van der Vaals force or the electrostatic force. As a result, damages of the element caused by the peeling force may be reduced, and the resultant fabrication yield is favorable.

Figure 9:
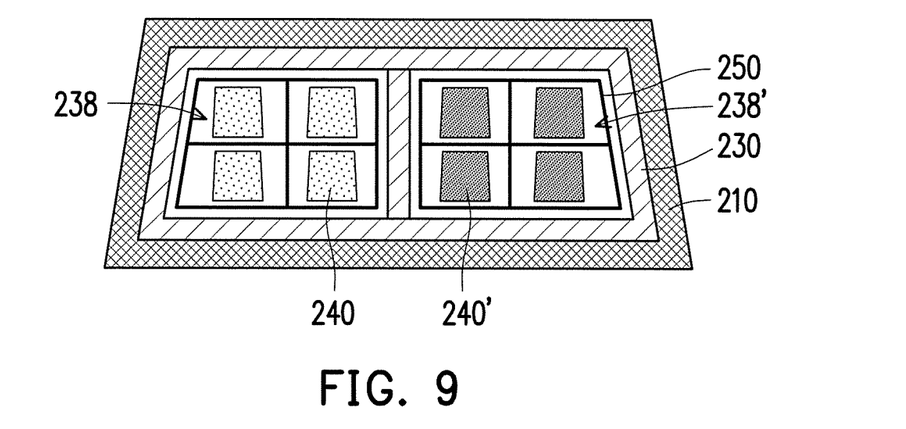
FIG. 9 is a schematic view of some steps of a fabrication method of a flexible electronic device according to another embodiment of the invention.
Figure 10:
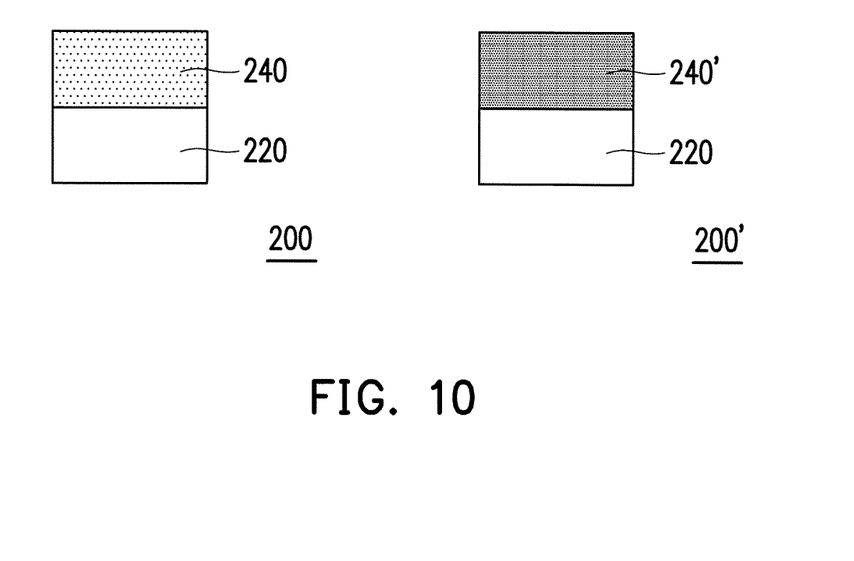
FIG. 10 are schematic cross-sectional views of a first electronic device and a second electronic device according to another embodiment of the invention.

FIG. 9 is a schematic view of a fabrication method of a flexible electronic device according to another embodiment of the invention. A difference between the embodiment shown in FIG. 9 and the embodiment shown in FIG. 7 lies in that a first electronic device 200 having a first electronic element 240 (shown in FIG. 10) and a second electronic device 200' having a second electronic element 240' may be formed by conducting the fabrication method illustrated in FIG. 9. Specifically, referring to FIG. 9, a melted edge 230 provided in the embodiment is formed in a manner similar to that of the melted edge 130 provided in the first embodiment. Differences therebetween include an area region surrounded by the melted edge 230 as provided in the embodiment includes a first area region 238 and a second area region 238' that are arranged in a side-by-side manner. Moreover, in the embodiment, the first electronic element 240 and the second electronic element 240' are respectively formed on the first area region 238 and the second area region 238' of a flexible substrate 220. A separation process is performed to separate the melted edge 230 from the flexible substrate 220. The separation process in the embodiment is similar to the separation process in the first embodiment. A difference therebetween is that the flexible substrate 220 is cut along a cutting line 250 to form the first electronic device 200 having the first electronic element 240 (shown in FIG. 10) and the flexible substrate 220 and the second electronic device 200' having the second electronic element 240' and the flexible substrate 220 as shown in FIG. 10.

Figure 11A:
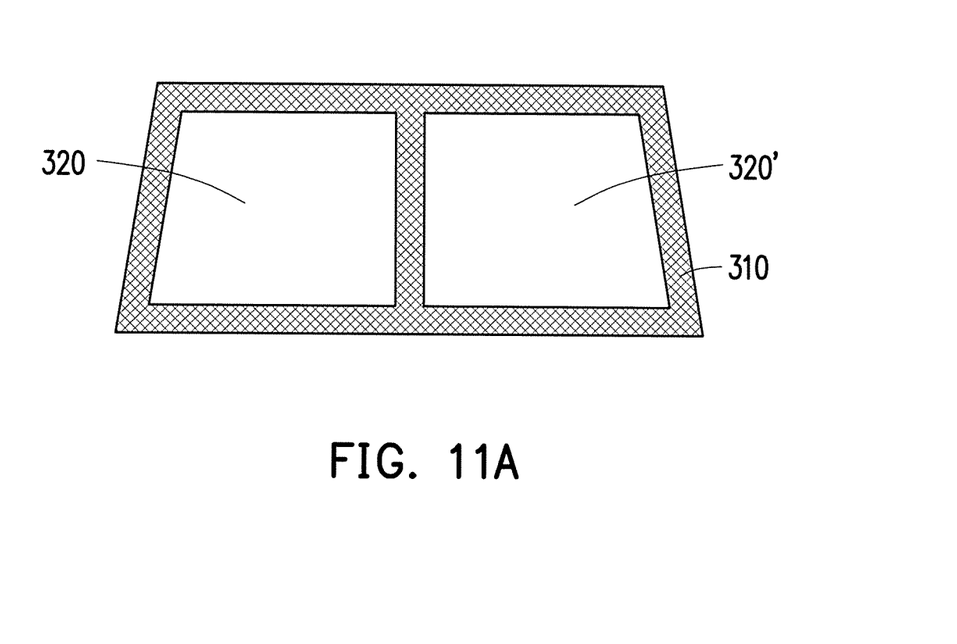
FIG. 11A is a schematic view of a step of placing a flexible substrate in a fabrication method of a flexible electronic device according to still another embodiment of the invention.
Figure 11B:
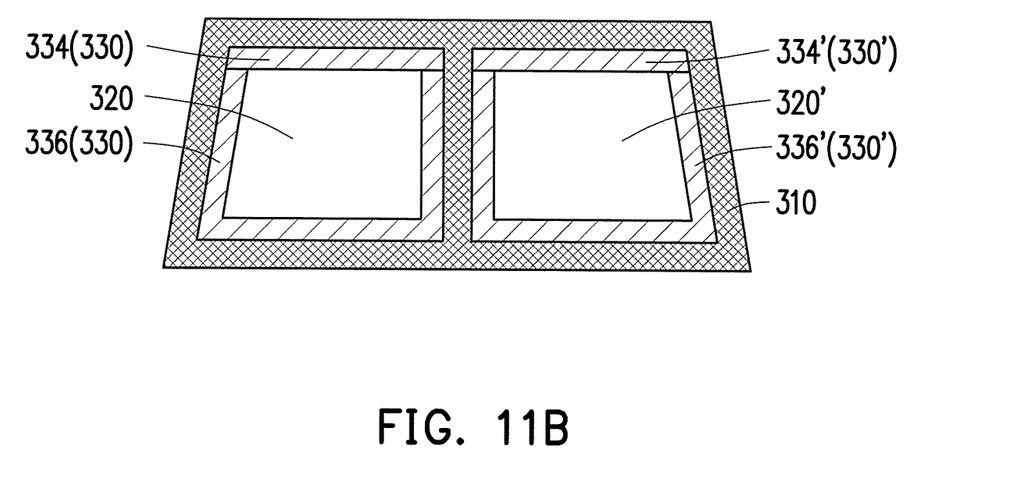
FIG. 11B is a schematic view of a step of forming a melted edge in a fabrication method of a flexible electronic device according to still another embodiment of the invention.

FIG. 11A and FIG. 11B are schematic views of a fabrication process of a flexible electronic device according to still another embodiment of the invention. A fabrication method of a flexible electronic device in the embodiment is similar to that in the first embodiment. A difference therebetween is that two flexible substrates, i.e., a first flexible substrate 320 and a second flexible substrate 320', are used in the fabrication method provided in this embodiment. Referring to FIG. 11A, the first flexible substrate 320 and the second flexible substrate 320' are placed directly on a rigid substrate 310, and the first flexible substrate 320 and the second flexible substrate 320' do not overlap. An area of the rigid substrate 310 is greater than an overall area occupied by both the first flexible substrate 320 and the second flexible substrate 320', such that the first flexible substrate 320 and the second flexible substrate 320' may be completely held on the same side of the rigid substrate 310.

Referring to FIG. 11B, a first heating process is performed, such that one heated portion of an edge of the first flexible substrate 320 constitutes a first melted edge 334, and that one heated portion of an edge of the second flexible substrate 320' constitutes a third melted edge 334'. After the first heating process is performed, a second heating process is performed, such that the other heated portion of the edge of the first flexible substrate 320 constitutes a second melted edge 336, and that the other heated portion of the edge of the second flexible substrate 320' constitutes a fourth melted edge 336'. The first melted edge 334 and the second melted edge 336 of the first flexible substrate 320 are connected to form a melted edge 330. The third melted edge 334' and the fourth melted edge 336' of the second flexible substrate 320' are connected to form a melted edge 330'. An electronic element (not shown) is adapted to be formed on an area region surrounded by the melted edge 330 and the melted edge 330'. The first flexible substrate 320 and the second flexible substrate 320' are located between the electronic element (not shown) and the rigid substrate 310. After the electronic element (not shown) is formed, a separation process is performed to separate the melted edge 330 from the flexible substrate 320 and to separate the melted edge 330' from the second flexible substrate 320'; thereby, individual flexible electronic devices may be respectively formed.

In another embodiment, the first flexible substrate 320 and the second flexible substrate 320' may be placed directly on the rigid substrate 310. Different from above, in the embodiment, the heating process may first be performed on the first flexible substrate 320 to form the first melted edge 334 and the second melted edge 336 of the first flexible substrate 320 connected to each other, and thereby the melted edge 330 is formed. After that, the third melted edge 334' and the fourth melted edge 336' of the second flexible substrate 320' connected to each other are formed, and thereby the melted edge 330' is formed. The electronic element (not shown) is adapted to be formed on an area region surrounded by the melted edge 330 of the first flexible substrate 320 and the melted edge 330' of the second flexible substrate 320'. The first flexible substrate 320 and the second flexible substrate 320' are located between the electronic element (not shown) and the rigid substrate 310. After the electronic element (not shown) is formed, the separation process is performed to separate the melted edge 330 from the flexible substrate 320 and separate the melted edge 330' from the second flexible substrate 320'. As such, the flexible electronic device is formed.

In view of the foregoing, according to the fabrication method of the flexible electronic device provided by the embodiments of the invention, the flexible substrate may be removed from the rigid substrate in no need of applying a relatively strong peeling force during the fabrication process. Thereby, damages to the element may be reduced, and the resultant fabrication yield is favorable. Besides, the flexible substrate and the rigid substrate are adhered to each other without using any external adhesive, and therefore, costs of the adhesive may be saved, and the relevant coating step can be omitted.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A fabrication method of a flexible electronic device, comprising:
    placing a first flexible substrate directly on a rigid substrate, wherein the first flexible substrate comprises an edge and an area region surrounded by the edge;
    heating a portion of the edge of the first flexible substrate, such that the heated portion of the edge of the first flexible substrate constitutes a melted edge;
    forming an electronic element on the first flexible substrate, the electronic element being located in the area region; and
    performing a separation process, such that the melted edge is separated from the first flexible substrate, forming the flexible electronic device,
    wherein the step of heating the portion of the edge of the flexible substrate comprises:
        performing a first heating process, such that a heated first portion of the edge of the first flexible substrate constitutes a first melted edge;
        performing a planarizing process to remove an air cavity which is located in a middle area of the area region and between the first flexible substrate and the rigid substrate after the first melted edge is formed, the planarizing process comprising an environmental depressurization step; and performing a second heating process after the air cavity is removed, such that a heated second portion of the edge of the first flexible substrate constitutes a second melted edge, wherein the first heating process is performed under a first ambient air pressure, the second heating process is performed under a second ambient air pressure, and the first ambient air pressure is greater than the second ambient air pressure.

2. The fabrication method of the flexible electronic device as claimed in claim 1, wherein the melted edge completely forms a surroundings of the first flexible substrate.

3. The fabrication method of the flexible electronic device as claimed in claim 1, wherein the first melted edge and the second melted edge completely form a surroundings of the first flexible substrate.

4. The fabrication method of the flexible electronic device as claimed in claim 1, wherein the planarizing process further comprises one of a pressurization step and a heating step, and the pressurization step comprises applying a pressure to the rigid substrate from a surface of the first flexible substrate by exerting a mechanical force.

5. The fabrication method of the flexible electronic device as claimed in claim 1, wherein the environmental depressurization step comprises placing the rigid substrate and the first flexible substrate in a device with a closed chamber and lowering an air pressure in the device.

6. The fabrication method of the flexible electronic device as claimed in claim 1, wherein the portion of the edge of the first flexible substrate is heated through a laser heating method or a contact heating method.

7. The fabrication method of the flexible electronic device as claimed in claim 6, wherein the step of performing the contact heating method comprises contacting the portion of the edge of the first flexible substrate with a heated object.

8. The fabrication method of the flexible electronic device as claimed in claim 1, wherein the separation process comprises cutting the first flexible substrate along an inner side of the melted edge, such that the melted edge is separated from the first flexible substrate forming the flexible electronic device.

9. The fabrication method of the flexible electronic device as claimed in claim 8, wherein the separation process further comprises removing the cut first flexible substrate from the rigid substrate after the melted edge is separated from the first flexible substrate, forming the flexible electronic device.

10. The fabrication method of the flexible electronic device as claimed in claim 1, wherein a material of the first flexible substrate comprises a polymer, and a glass transition temperature of the first flexible substrate is lower than a glass transition temperature of the rigid substrate or a melting point of the rigid substrate.

11. The fabrication method of the flexible electronic device as claimed in claim 1, wherein a material of the rigid substrate is identical to a material of the first flexible substrate, and a thickness of the rigid substrate is greater than a thickness of the first flexible substrate.

12. The fabrication method of the flexible electronic device as claimed in claim 1, wherein
the area region comprises a first area region and a second area region that are arranged in a side-by-side manner,
the step of forming the electronic element comprises forming a first electronic element and a second electronic element respectively in the first area region and the second area region; and
the separation process further comprises separating the first area region from the second area region, so as to respectively form a first electronic device having the first electronic element and a second electronic device having the second electronic element.

13. The fabrication method of the flexible electronic device as claimed in claim 1, further comprising:
placing a second flexible substrate directly on the rigid substrate;
heating a portion of an edge of the second flexible substrate, such that the heated portion of the edge of the second flexible substrate constitutes a second melted edge;
forming a second electronic element on the second flexible substrate, the second electronic element being located in an area region of the second flexible substrate; and
performing another separation process, such that the second melted edge is separated from the second flexible substrate to form a first flexible electronic device.

* * * * *